United States Patent [19]
Karolys et al.

[11] Patent Number: 4,935,846
[45] Date of Patent: Jun. 19, 1990

[54] ELECTRONIC ASSEMBLY

[75] Inventors: Alexis G. Karolys, San Clemente; Gen Miake, Orange; Nikul S. Kapadia, Laguna Niguel, all of Calif.

[73] Assignee: Allied-Signal Inc., Morris Township, Morris County, N.J.

[21] Appl. No.: 335,613

[22] Filed: Apr. 10, 1989

[51] Int. Cl.$^5$ ............................................. H05K 7/10
[52] U.S. Cl. .................................. 361/391; 361/394; 361/395; 361/413; 439/483
[58] Field of Search ............... 361/331, 380, 391, 394, 361/395, 399, 413, 415; 439/377, 478, 481, 483

[56] References Cited
U.S. PATENT DOCUMENTS 3,014,160  12/1961  Brogden ............................ 361/391
4,236,190  11/1980  Hollingsead et al. ............. 361/391

Primary Examiner—Gregory D. Thompson
Attorney, Agent, or Firm—Robert C. Smith; James W. McFarland; Robert A. Walsh

[57] ABSTRACT

There are electronic instrumentation assemblies in which most of the hard wired circuitry and functions are very similar for a significant number of different applications yet each assembly for a separate application is fabricated as a separate unit. Applicants system includes a single electronic circuit assembly for all such applications including a large plug-in connector, and a much smaller faceplate assembly with a mating connector unit containing software in the form of one or more PROMs plus a limited number of discrete components. An instrumentation assembly for a particular application includes the correctly programmed faceplate assembly which is plugged directly into the front panel of the electronic circuit assembly. As compared with having a separate electronic assembly for each different application, the present arrangement permits the major part of the assembly to be a single assembled unit with a single part number, configuration control, assembly and test procedure etc. The variations attributable to the different applications involve differently programmed PROMs fastened to the relatively small plug-in faceplate assemblies.

6 Claims, 1 Drawing Sheet

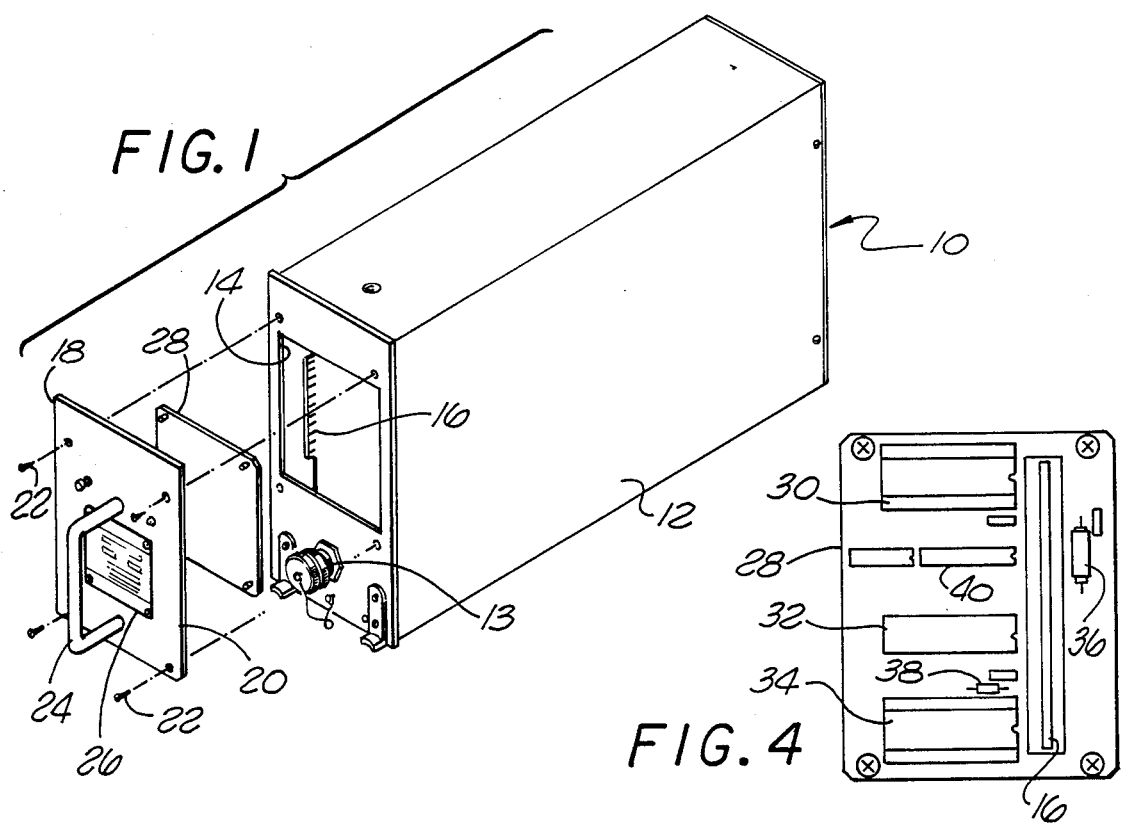
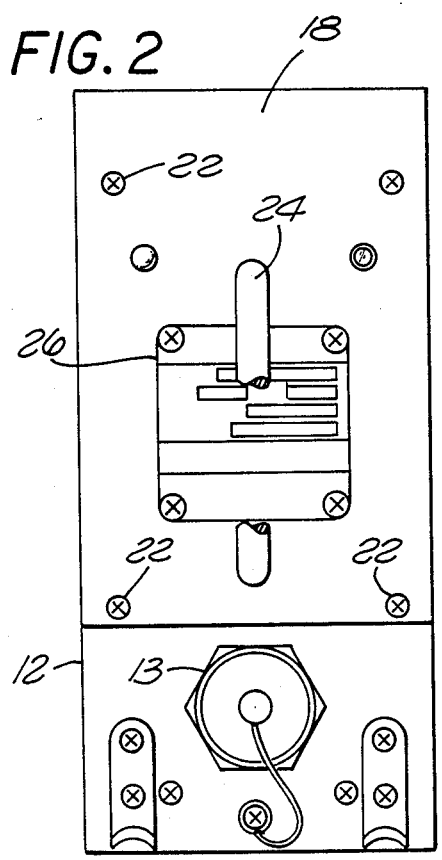
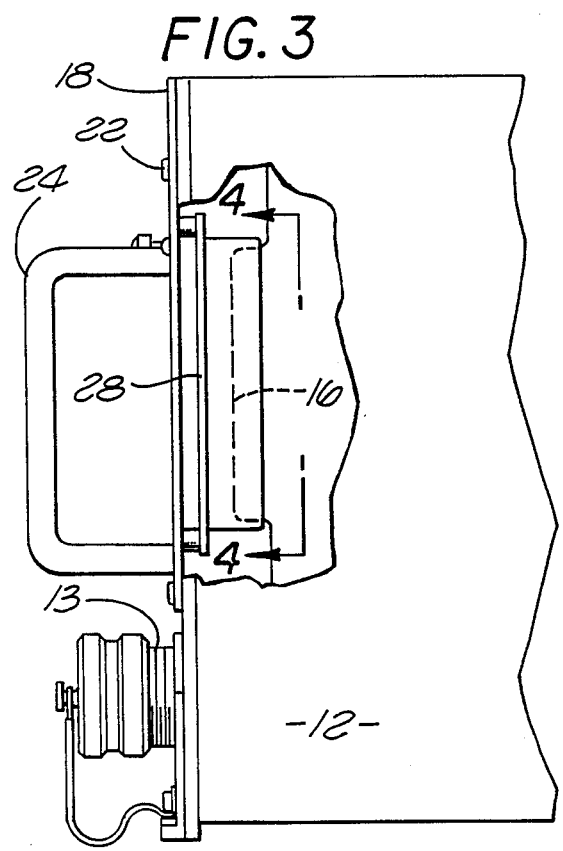

ELECTRONIC ASSEMBLY

BACKGROUND OF THE INVENTION

This invention relates to electronic assemblies and more particularly to an assembly system and technique which greatly simplifies assembly, testing and configuration control for some kinds of electronic assembly packages.

There are electronic instrumentation assemblies in which a signal representing a certain variable condition is processed preparatory to forwarding the processed signal to a control system or a display device and wherein such assemblies are produced in significant volume and used for a number of different applications or installations. In many cases the different applications require only slight variations among the units produced, yet this variation requires that the units be separately designed, assembled, tested, calibrated and given separate part numbers. One example of such units is a signal conditioning device which receives input signals from piezoelectric vibration sensors in gas turbine engines and provides such signals to the cockpit of an aircraft to inform the pilot or flight engineer of the fact of engine vibration in excess of a desired amplitude and also the time the engine is exposed to such vibration. This information may be used to determine when an engine requires major servicing or overhauling.

Such instrumentation assemblies have been in use for many years. In accordance with the prior art the assembly for each engine was different; in some cases the assemblies for the same engines used on different aircraft were different. Each had a different part number, and was built, tested and calibrated differently. In the case of aircraft used for carrying passengers, the Federal Aviation Authority requires certain configuration controls which are applicable to each part number. Since some airlines have several types of aircraft and engines, this has led to complicated and involved servicing procedures.

SUMMARY OF THE INVENTION

Following an analysis of the several types of such vibration signal processes it appeared to applicants that, with careful design, it would be possible to produce a single electronic assembly which would incorporate essentially all of the required functions including a central processing unit or computer, and signal processing and amplifier means which were common to the various different assemblies if the variables could all be segregated and incorporated into software or firmware. This general approach has been used in the past wherein an assembly could be changed by the removal and replacement of one of several circuit boards. Since the circuit board is located within the housing, it is necessary to open the housing to change it. Sometimes this is difficult because of the fragile connections and connectors used. Each housing must still be viewed as a different assembly depending upon which circuit board is installed, it will be subjected to different testing and calibration procedures and will receive a different part number.

Applicants have designed a series of signal conditioning systems for processing sensed vibration signals which simplify the above concerns. An electronic assembly is produced which includes the hardwired electronic circuitry necessary to process the vibration signals and this assembly includes all the functions which are common to the several control systems applications. This single assembly is separately tested, calibrated and receives its own part number for configuration control. The variables which previously made each assembly different from others are incorporated in a plug-in module having a separate part number and containing software, or actually, firmware in the form of one or more programmable integrated circuits (PROMs) mounted on a faceplate and which are connected to a durable plug-in connector also mounted on the faceplate. The mating connector is mounted on a recessed circuit board card edge at the front of the electronic assembly so that the faceplate, which preferably includes its own identification plate, part number and a handle, may be directly plugged into the electronic assembly thus covering the part number of the electronic assembly. The combined units then perform the same function as the prior art assemblies but only the faceplate and firmware portion of the system needs to be different and the main electronic assembly is a single design which can be used for all similar applications. Configuration control involves only one part number for the electronic assembly which is of significant physical size and complexity and separate part numbers for each faceplate and firmware assembly, which is small. With this arrangement, a malfunction in the electronic assembly may be dealt with by replacing this assembly with another identical box and the faceplate and firmware assembly can be easily unplugged from one such box or assembly and plugged into another. As a further simplification the faceplate and firmware assemblies may be formed with PROMs which, before programming, were identical units.

The economic and serviceability value of this invention is very substantial. A large airline, for example may operate five or six different kinds of aircraft with even more different engine types to maintain. Under the prior art system, separate complete electronic assemblies are required for each aircraft/engine combination. Each such assembly has a separate part number, is calibrated and serviced individually and, of course, has to be manufactured as a separate item leading to higher first cost. The numbers of spare units required to be available for servicing is greater, hence the airline's investment in spare parts is greater. With the system described herein, only the software in the form of the above described faceplate and PROMs has to be stocked in comparable numbers. The electronic assemblies, being all the same, require substantially fewer units to be available. Servicing is simplified since technicians have only one main electronic assembly to be acquainted with and the faceplate assemblies are easily and readily replaced. As compared with prior art assemblies in which several circuit boards may be enclosed in a "black box" and one of the boards may be replaced to change the system configuration, applicants' system is advantageous for a number of reasons: (1) the configuration control problem still exists with the prior art system because the "black box" has to be given a different part number for each different replaceable circuit board; (2) such replaceable circuit boards normally have many contact pins or sockets to mate with the remainder of the assembly and such contact pins and sockets tend to be fragile and easily misaligned such that considerable skill may be required to remove and install such boards without damage to the connectors; and (3) unlike applicants' structure the housing has to be opened to provide access to the removable circuit board.

IN THE DRAWINGS

FIG. 1 is an exploded view, in perspective, of an electronic instrumentation assembly according to our invention;

FIG. 2 is a front view of the faceplate and firmware assembly of FIG. 1 installed on the electronic assembly;

FIG. 3 is a side view, partly broken away, showing the faceplate and firmware assembly attached to the electronic assembly; and FIG. 4 is a view, taken along line 4—4 of FIG. 3 showing the rear side of the faceplate and firmware assembly.

DESCRIPTION OF THE PREFERRED EMBODIMENTS

Referring now to FIG. 1, an electronic assembly unit is shown at numeral 10 which includes a substantial amount of computer, signal conditioning and amplification circuitry contained in a metal housing 12. Housing 12 includes an electrical connector 13 at the front, a rectangular opening 14, and part of a plug-in connector 16 visible on a bracket recessed a short distance within the opening. A faceplate and firmware module or assembly 18 is shown displaced from housing 12 which includes a faceplate 20 which is attached to housing 12 by means of screws 22 as indicated. A handle 24 is securely fastened to faceplate 20 as is an identification plate 26 which will normally carry a part number and other useful information depending upon the exact nature of assembly 10. Not visible in FIG. 1 is the mating part of connector 16 which is mounted on a chassis plate 28 carrying a limited number of discrete components and one or more PROMs, to be described below.

FIG. 2 is a view from the front of the faceplate and firmware module 18 showing the identification plate 26 and handle 24, shown partly broken away. The module 18 is fastened to housing 12 by means of screws 22. The electrical connector 13 is visible at the front of the housing 12 below module 18.

FIG. 3 is a view from the side of housing 12 with module 18 installed and with housing 12 shown partially cut away to show the plug in connector 16. As described above, module 18 is fastened to housing 12 by means of screws 22 which places chassis plate 28 within housing 12. The female side of connector 16 is shown attached to chassis plate 28 and receives the multiple pins from the opposite half of the connector which is carried on a recessed bracket within housing 12.

FIG. 4 is a view taken along line 4—4 of FIG. 3 and shows the opposite side of chassis plate 28 which carries the female part of connector 16, the programmed integrated circuits on PROMs 30, 32, 34 and a limited number of discrete components in the form of resistors and capacitors 36, 38, 40 etc.

From the foregoing it will be recognized that applicants have provided an electronic assembly having considerable advantage over the prior art systems in that configuration control is simplified, assembly and test are greatly simplified through the use of a single main electronic assembly, servicing is simplified and substantial money saved through reducing the need to stock many different types of electronic units. While a single embodiment has been described herein, those skilled in the art will envision other applications for the teachings herein and the present invention should not be limited other than by the scope of the following claims.

We claim:

1. An electronic assembly comprising a housing, electronic circuit means in said housing including computer means and signal processing and amplification means, said housing having a front face, an opening in said front face and a first connector element recessed in said housing inside of said opening,
    a removable module adapted to be attached to said front face including a faceplate, a chassis plate attached to the back side of said faceplate, programmable integrated circuit means fastened to said chassis plate, said circuit means having been programmed, a second connector element mating with said first connector element fastened to said chassis plate, a handle and an identification plate fastened to the front side of said faceplate;
    and means fastening said module to said housing such that said first and second connector elements are connected together and said programmed integrated circuits are connected to said electronic circuit means.

2. An electronic assembly as claimed in claim 1 wherein said programmable integrated circuit means may be programmed depending upon the type of engine associated with said electronic assembly.

3. An electronic assembly comprising a housing, electronic components in said housing, a front panel and an opening in said front panel, and first electrical connector means in said housing recessed a short distance from said opening;
    a removable module including a faceplate, a chassis plate mounted on said faceplate and sized to pass through said opening, programmable integrated circuit means fastened to said chassis plate, said circuit means having been programmed, second electrical connector means adapted to mate with said first connector means mounted on said chassis plate and means for fastening said module to said housing such that said first and second connector means are connected and said programmable integrated circuit means are electrically connected to said electronic components in said housing.

4. In an electronic assembly comprising a housing containing electronic components including computer means, said assembly also including firmware in the form of programmable integrated circuits for programming said computer means:
    characterized in that said housing includes a front face panel with an opening and a first connector element within and accessible through said opening and connected to said computer means,
    a separable module including a faceplate with a second connector element mounted on the rear side thereof adapted to mate with said first connector element, said module including programmable integrated circuits mounted on the rear side of said module and connected to said second connector element,
    and means securing said module to said front face panel such that it is readily removable and replaceable with a different such separable module also having programmable integrated circuits and a connector element mating with said first connector element but wherein said programmable integrated circuits of said different module may be programmed differently.

5. An electronic assembly as claimed in claim 4 wherein said front face panel includes identification means identifying said housing and its contents, each said separable module carries a separate identification means, said identification varying with different programming of said programmable integrated circuits.

6. An electronic assembly as claimed in claim 5 wherein said module covers the identification number on said front face panel when said module is attached to said front face panel.

* * * * *

REEXAMINATION CERTIFICATE (3565th)

United States Patent [19]
Karolys et al.

[11] B1 4,935,846
[45] Certificate Issued Jul. 7, 1998

[54] ELECTRONIC ASSEMBLY

[75] Inventors: Alexis G. Karolys, San Clemente; Gen Miake, Orange; Nikul S. Kapadia, Laguna Niguel, all of Calif.

[73] Assignee: Endevco Corporation, San Juan Capistrano, Calif.

Reexamination Request:
No. 90/004,676, Jun. 24, 1997

Reexamination Certificate for:
Patent No.: 4,935,846
Issued: Jun. 19, 1990
Appl. No.: 335,613
Filed: Apr. 10, 1989

[51] Int. Cl.$^6$ .................................................. H05K 7/10
[52] U.S. Cl. .................... 361/684; 361/730; 361/737; 361/785; 439/483
[58] Field of Search ........................... 361/601, 679, 361/683, 684, 730, 737, 785; 439/377, 478, 481, 483

[56] References Cited

U.S. PATENT DOCUMENTS

| | | | |
|---|---|---|---|
| 4,352,492 | 10/1982 | Smith | 273/1 GC |
| 4,954,928 | 9/1990 | Jullien | 361/391 |

OTHER PUBLICATIONS

Supplement 1 to Arinc Report 607, "Design Guidance for Avionic Equipment," published Jul. 22, 1987, Aeronautical Radio, Inc., Annapolis, Maryland.

Illustrated Parts Catalog, Separated from Component Maintenance Manual, "System Data Acquisition Concentrator 350E511031C," dated Oct. 15, 1987, No. 31-55-34, Aerospatiale, Cedex, France.

Component Maintenance Manual with Separate Illustrated Parts Catalog, "System Data Acquisition Concentrator 350E511031C," dated Oct. 30, 1987, No. 31-55-34, Aerospatiale, Cedex, France.

ARINC Report 607-2, "Design Guidance for Avionic Equipment," Published Oct. 30, 1996, Aeronautical Radio, Inc., Annapolis, Maryland.

*Primary Examiner*—Gregory D. Thompson

[57] ABSTRACT

There are electronic instrumentation assemblies in which most of the hard wired circuitry and functions are very similar for a significant number of different applications yet each assembly for a separate application is fabricated as a separate unit. Applicants system includes a single electronic circuit assembly for all such applications including a large plug-in connector, and a much smaller faceplate assembly with a mating connector unit containing software in the form of one or more PROMs plus a limited number of discrete components. An instrumentation assembly for a particular application includes the correctly programmed faceplate assembly which is plugged directly into the front panel of the electronic circuit assembly. As compared with having a separate electronic assembly for each different application, the present arrangement permits the major part of the assembly to be a single assembled unit with a single part number, configuration control, assembly and test procedure etc. The variations attributable to the different applications involve differently programmed PROMs fastened to the relatively small plug-in faceplate assemblies.

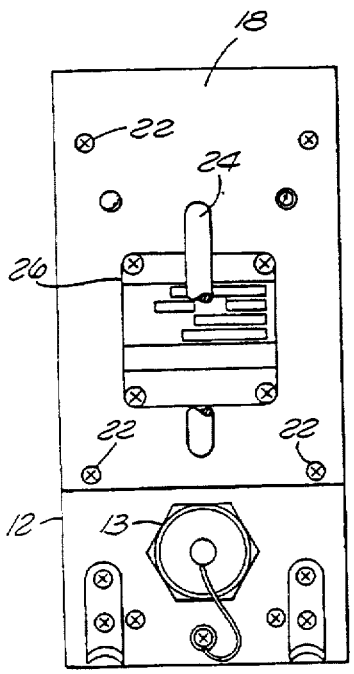

REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 1–6 is confirmed.

* * * * *